United States Patent [19]

Chuang et al.

[11] 4,421,996
[45] Dec. 20, 1983

[54] SENSE AMPLIFICATION SCHEME FOR RANDOM ACCESS MEMORY

[75] Inventors: Patrick T. Chuang, Cupertino; Paul D. Keswick, San Jose, both of Calif.

[73] Assignee: Advanced Micro Devices, Inc., Sunnyvale, Calif.

[21] Appl. No.: 310,180

[22] Filed: Oct. 9, 1981

[51] Int. Cl.³ .................... H03K 5/24; G01R 19/165; G11C 7/06
[52] U.S. Cl. .................... 307/530; 307/594; 307/596; 365/205
[58] Field of Search ......... 307/355, 362, 530, DIG. 3, 307/594–596; 365/205

[56] References Cited

U.S. PATENT DOCUMENTS

| | | | |
|---|---|---|---|
| 4,021,682 | 5/1977 | Elmer et al. | 307/530 X |
| 4,050,061 | 9/1977 | Kitagawa | 365/205 |
| 4,119,870 | 10/1978 | Zibert | 307/355 |
| 4,119,871 | 10/1978 | Zibert | 307/355 |
| 4,158,241 | 6/1979 | Takemae | 365/205 |
| 4,195,239 | 3/1980 | Suzuki | 307/355 |
| 4,239,993 | 12/1980 | McAlexander et al. | 307/355 |
| 4,262,342 | 4/1981 | Tuan | 365/205 X |
| 4,274,013 | 6/1981 | Clemons et al. | 307/530 |

OTHER PUBLICATIONS

Kuo et al., "16-K RAM Built with Proven Process May Offer High Start-Up Reliability", *Electronics*, pp. 81–86; 5/13/76.

*Primary Examiner*—Larry N. Anagnos
*Attorney, Agent, or Firm*—Gary T. Aka; Patrick T. King

[57] ABSTRACT

In source-clocked type of cross-coupled latch sense amplifier of a dynamic random access memory device, there is provided a sense clock that employs multiple extended dummy memory cells to provide reference timing which tracks time constants of word line, cell transfer gate, cell capacitor, and bit line, and the sense clock is further compensated over large variations of fabrication process parameters and operating conditions. The trigger and slave clock circuit are chained in series to control the timing sequence of a plurality of clocked output signals. The clocked output signals are selectively amplified and summed in parallel to generate current with an intended dynamic characteristic. The current so generated is applied to the common source electrodes of the cross-coupled latch.

11 Claims, 6 Drawing Figures

SENSE AMPLIFICATION SCHEME FOR RANDOM ACCESS MEMORY

DESCRIPTION

Background of the Invention

1. Field of the Invention

This invention relates to sense timing control of a sense amplifier in an integrated circuit dynamic random access memory. In particular, the invention relates to the control of sense timing with respect to variations in circuit operating conditions and fabrication process parameters. The invention has particular application to metal oxide semiconductor (MOS) dynamic random access memories (dynamic RAM).

In a dynamic random access memory, digital information is stored in the form of capacitive charge in a storage cell, which can be addressed and sensed by conventional external means. The charge increment in a storage cell is typically sensed by means of a cross-coupled MOSFET sensing circuit incorporated into a common integrated circuit die. The data sensing scheme employed is known as the dummy cell reference technique. In this technique, one side of the sense amplifier is coupled to a bit line. It compares the stored charge level in an addressed bit cell to the stored charge level in a dummy cell connected to the complementary bit line of the sense amplifier. Timing of the sense operation is critical to the correct comparison of charge on the opposing bit lines. The sense time, that is, the time required of the memory of (1) address the desired bit, (2) allow signals to stabilize and (3) read the bit value, is a significant portion of the total read access time of a memory. In the process of accessing data, speed and the competing factor of accuracy are of the essence. Design trade offs are necessary to optimize memory access speed without sacrificing accuracy.

In order to assure accuracy, an adequate signal margin is required for the sense amplifier. Also, this sense amplifier must be highly sensitive. Inherent parasitic capacitances and resistances in the circuitry, as well as power supply level and fabrication process variation, affect the speed and settling time of signals along the critical paths of the memory, and the sensitivity of the sense amplifier. In order to assure adequate signal margins, a fully compensated clocking circuit for controlling the sensing circuitry of a cross-coupled sense amplifier is needed. That is, it must optimize speed of operation without degradation of accuracy over the range of operating conditions and fabrication process parameters affecting a capacitive memory array such as a dynamic random access memory.

2. Description of the Prior Art

The operation of dynamic random access memories with a cross-coupled type of sense amplifier is taught elsewhere, for example, in U.S. Pat. No. 3,514,765 to Christensen entitled "Sense Amplifier Comprising Cross-Coupled MOSFET'S Operating in a Race Mode for Single Device Per Bit MOSFET Memories", U.S. Pat. No. 3,678,473 to Wahlstrom entitled "Read-Write Circuit for Capacitive Memory Arrays", in the Intel Memory Design Handbook published by Intel Corporation of Santa Clara, Calif. (copyright 1977), in papers by John J. Barnes and John Y. Chan entitled "A High Performance Sense Amplifier for a 5 V Dynamic RAM", published in *IEEE Journal of Solid-State Circuits*, Vol. SC-15, October 1980, pp. 831-838; by Lee et al. entitled "A 80ns 5V-Only Dynamic RAM", in *ISSCC Digest of Technical Papers*, February 1979, pp. 146-147; and by White et al. entitled "A 5V-Only 64K Dynamic RAM", in *ISCC Digest of Technical Papers*, February 1980, pp. 230-231. Examination of a simplified sense amplifier schematic diagram typical of the prior art will clarify the sensing operation and illustrate some of the deficiencies in the prior art.

Turning to FIG. 1, there is shown a typical prior art arrangement of a sense amplifier 10 of the source clock variety, i.e., source electrodes 12 and 14 of cross-coupled field effect transistors 16 and 18 are coupled in common to form a latch 20 which is strobed to the ground voltage by main phase sense clock $\bar{\phi}_S$ (The present invention is not applicable to use with sense amplifiers where the source electrodes of the latch 20 are tied to the ground. A source clock design is typically chosen because it provides higher speed response for a given signal sensing margin, uses less current than the comparable drain clock design, and typically requires simpler integrated circuit layout techniques in the N-channel implementation.). A left side storage cell 22 and a right side storage cell 24 are coupled, respectively, to a left bit line 26 (node A) and right bit line 28 (node B). A plurality of bit cells is coupled to each bit line, each one of which is accessed by means of a word line or row address select signal ($WL_m$ for left bit lines and $WL_n$ for right bit lines) which switches a transfer gate 30, 32. When the transfer gate 30, 32 is on, a storage capacitor 34, 36 is electrically coupled to the respective bit line 26, 28 so that charge across the storage capacitor 34, 36 can be sensed on the bit line 26, 28. Each bit line 26, 28 has inherent capacitance, represented here by capacitors 38, 40 to ground, between the bit line 26, 28 and the substrate. This inherent capacitance, together with the inherent resistance of the bit lines, gives rise to a characteristic RC time constant. The RC delay of the bit line is a significant parameter in a circuit, particularly in a very dense capacitance storage circuit. Bit line precharge gates 42, 44 triggered by bit line precharge signals (BP) are employed to precharge the bit lines 26, 28 to the high voltage supply level $V_{CC}$. Each bit line 26, 28 is generally precharged to the same level according to conventional means.

Coupled to each bit line is a dummy storage cell 46, 48 respectively. Each dummy storage cell 46, 48 includes a transfer gate 50, 52 and a dummy storage capacitor 54, 56. The dummy transfer gate 50, 52 couples the dummy storage capacitor 54, 56 to the bit line 26, 28 when strobed by a dummy word line (LDWL and RDWL, for left dummy word line and right dummy word line). A reset gate 58, 60 across the dummy capacitor 54, 56 is employed for reset control of the dummy storage capacitor 54, 56 in response to a dummy reset signal ($\overline{DRS}$).

In the source clock sensing scheme as used herein, the main phase sense clock is applied to node C to pull down the common source electrodes 12 and 14 at a fixed or otherwise loosely controlled delay 13 following the address operation in response to the main phase initialization clock $\phi_X$. In prior art systems, the word line trigger signals and dummy word line trigger signals WL and DWL were clocked at a separate fixed or loosely coupled delay 15 following the main phase initialization clock $\phi_X$. Consequently, a race condition could exist between fixed delay 1 and fixed delay 2. Circuit designs of this type cannot be optimized for speed in order to assure functionally over a wide range of fabrication process parameters and operating conditions. Such circuit designs resulted in slow memory circuits as compared with the maximum speed obtainable in the circuits with the best process parameters. What is needed is a sense circuit in which sense speed is optimized without sacrificing accuracy of the read operation.

SUMMARY OF THE INVENTION

According to the invention, an apparatus is provided for use in a capacitive storage integrated circuit memory device having at least one sense amplifier of a type employing a latch including cross-coupled field effect transistors with common source electrodes. The sense amplifier is disposed for sensing and comparing charge on a bit line coupled to each drain electrode of each of the transistors of the latch. The bit lines are selectively coupled to a storage cell through a transistor switch gate in response to signals applied to a word line. The apparatus of this invention is disposed for controlling the sense rate of the bit lines and comprises means operative to sense the word line signals for use in a capacitive storage integrated circuit memory device having at least one sense amplifier of a type employing a latch including cross-coupled field effect transistors with common source electrodes, the sense amplifier for sensing and comparing charge on a bit line coupled to each drain electrode of each one of the transistors of the latch, each of the bit line being selectively coupled to a storage cell through a transistor switch transfer gate in response to signals applied to a word line, an apparatus for controlling sense rate of the bit lines comprising means operative to sense the word line signals for initiating a clock sequence, the clock sequence initiating means producing a first output signal having a first dynamic characteristic which is delayed relative to the word line signals; first clock means responsive to the first output signal for generating a second output signal having a second dynamic characteristic which is delayed relative to the first output signal; second clock means responsive to the second output signal for generating a third output signal having a third dynamic characteristic which is delayed relative to the second output signal and which overlaps in time the second output signal; and means operative to amplify current in proportion to at least the second output signal and to the third output signal and to sum the amplified current for applying current in a controlled manner to the common source electrodes to strobe the source electrodes at a controlled sense rate.

One feature of the invention is a source follower word line tracking clock for a sense amplifier whose speed is optimized over the range of fabrication process parameters in an integrated circuit. The word-line tracking circuitry clock is compensated with respect to rise time of the word line, the threshold voltage of the transfer gate of the addressed storage cell, and the time delay of the bit line.

In a specific embodiment, a plurality of sense clocks slave to a tracking circuit employ controlled threshold trigger-type switching stages and switching transistors of selected relative current amplification ratios to control the ratio of currents contributed among each one of the clock circuits. In addition, these sense clocks have reduced sensitivity to variations in power supply voltage and fabrication process parameters.

BRIEF DESCRIPTION OF THE DRAWINGS

The invention will be better understood by reference to the following detailed description taken in connection with the accompanying drawings in which.

DETAILED DESCRIPTION

Figure 1:
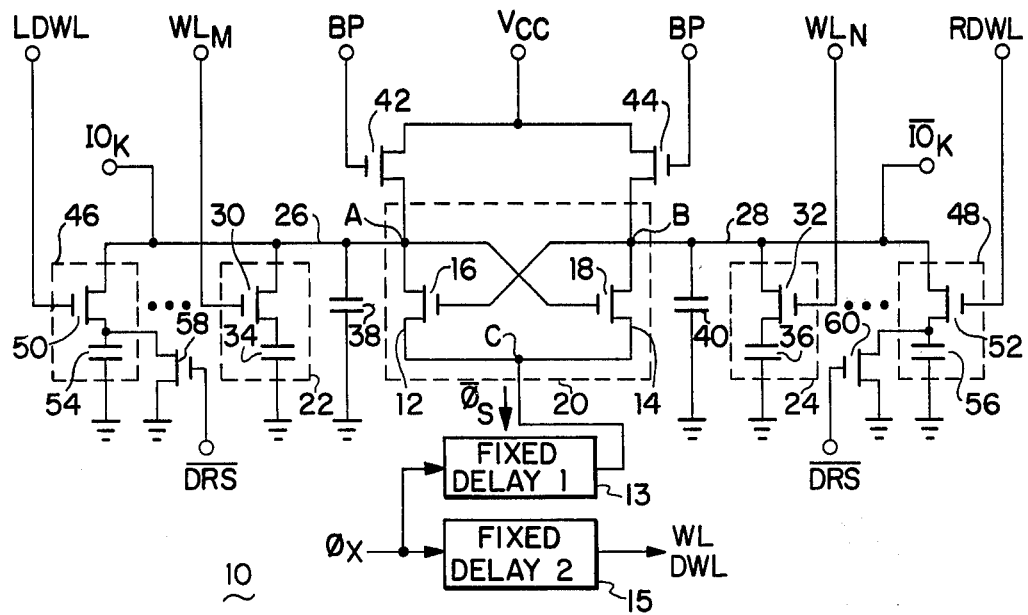
FIG. 1 is a schematic diagram and partial block diagram of a portion of a typical dynamic random access memory sense amplifier according to the prior art discussed hereinabove.
Figure 2:
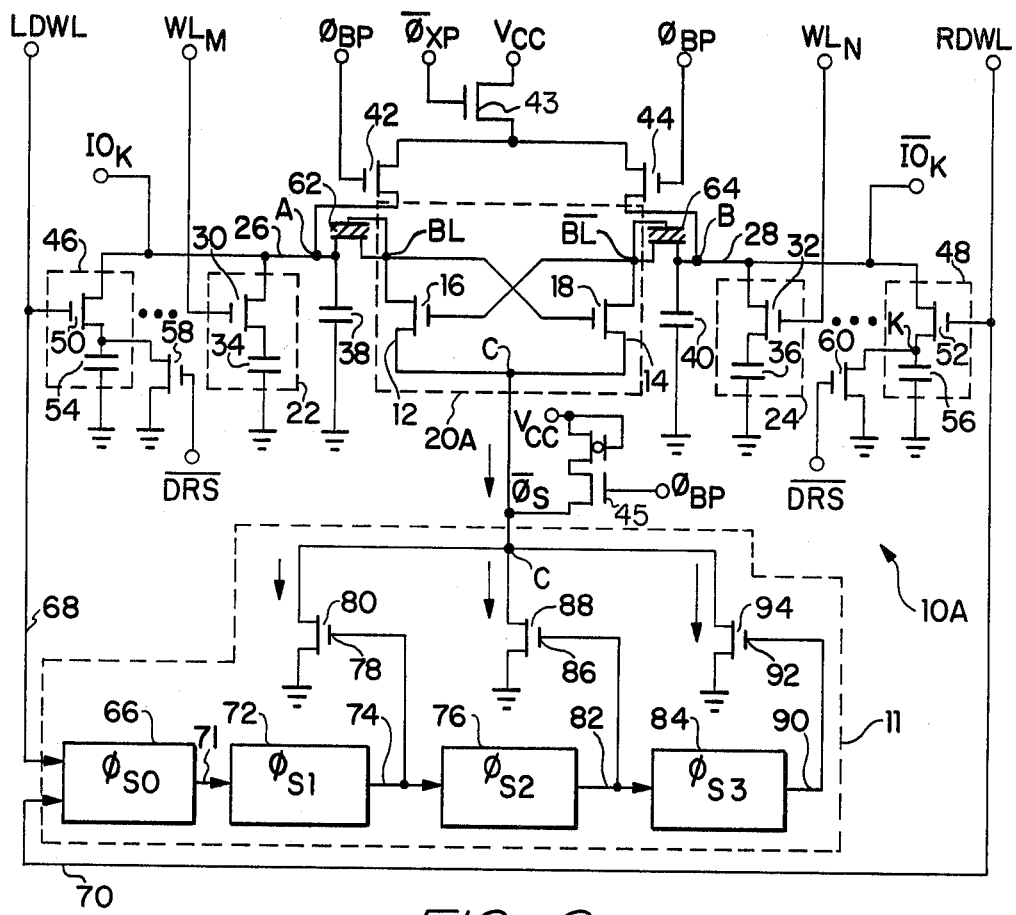
FIG. 2 is a schematic diagram and partial block diagram of a dynamic random access memory with a cross-coupled latch sense amplifier and source clocking circuitry according to the invention.

In FIG. 2, there is shown a sense amplifier 10A with a source current generator 11 according to the invention. Identical or substantially identical elements to the elements in the prior art in FIG. 1 are indicated by identical numerals.

The cross-coupled latch 20A of the invention includes a first transistor 16 and a second transistor 18 which are preferably enhancement mode MOS transistors. According to the invention, each bit sense line 26, 28 is coupled to the cross-coupled latch 20A through a current limiter 62, 64. The current limiter 62, 64 is a depletion mode transistor having gate and drain electrodes coupled to the drain electrode of the respective cross-coupled transistor 16, 18. This current limiter 62, 64 enhances the insensitivity of the source clocking circuitry to fabrication process parameter variations. For example, relying on the current limiting function of the current limiter 62, 64 rather than on the characteristic resistance of the bit line, the RC charging and discharging characteristic of the bit line is more consistent (Depletion mode isolation transistors are known to some prior art designs for current limiting between the bit sense lines and the cross-coupled latch. The importance of their relation to process parameter variations may not have been recognized in the past).

The source clock circuitry according to the invention comprises a tracking circuit 66 responsive according to the invention to either of the dummy word line signals through a left dummy word line 68 or a right dummy word line 70 to which is also coupled the gate electrode of the dummy cell transfer gate 50 or 60. The output of the delay driving circuit is coupled to a first slave clock 72 having a first output signal characteristic. The output line 74 of the first slave clock 72 is coupled to a second slave clock 76 having a second output signal characteristic and to the gate electrode 78 of a first current sink transistor 80. The signal output 82 of the second slave clock 76 is coupled to a third slave clock 84 of a third output characteristic and also to the gate electrode 86 of a second current sinking transistor 88. The output line 90 of the third clock 84 is coupled to the gate electrode 92 of a third current sink transistor 94. The source electrodes of the current sink transistors 80, 88 and 94 are coupled to the ground of the circuit. The drain electrodes are coupled to node C of the common sources 12, 14 of the cross-coupled latch 20A. Node C is thus a summing junction for the current through each one of the current sink transistors 80, 88 and 94. According to the invention, the first slave clock 72, second slave clock 76 and third slave clock 84 are chained to produce a timed output signal of a desired waveform characteristic and slope tailored to optimize in a selected manner the current through the source electrodes 12 and 14 from the respective drain electrode nodes A or B charged to the level of the storage capacitors 34, 36 of the addressed storage cell 22, 24 and dummy storage cell 46, 48.

In order to controllably tailor the composite dynamic characteristic of the source current, the transistors 80, 88 and 94 are scaled relative to one another. The first transistor 80 has a relatively small source-drain region. The third transistor 94 has as large a source-drain region as is possible. The second transistor 88 has a source-drain region of a size between the size of the first transistor 80 and the third transistor 94. The size of the source-drain region determines the dynamic gain or amplifying characteristic, as used herein, of each one of the transistors 80, 88 and 94 whereby the rate of current flow through the source-drain region of each one of the transistors is regulated. While the absolute rate of current flow through the respective transistors may vary with temperature and fabrication process variations, the relative rates of flow among the transistors 80, 88 and 94 is substantially constant. Similarly the timing delay between the triggering of each clock signal of the respective clocks 72, 76 and 84 is not absolutely fixed but may vary with operating temperature and fabrication process variations. Nevertheless, the relative timing, including the relative leading edge characteristics of the state change signal applied on the respective output lines 74, 82 and 90, is substantially invariant over the expected temperatures of operation and range of fabrication process variations. Consequently, the sense rate determined by the rate of current and voltage change at node C during a sense operation can be controlled very tightly, thereby eliminating undesired race conditions. The clock input signals through the dummy word lines 68, 70 track the delay characteristics of the word line and the respective bit lines 26, 28 to start the clock sequence. Finally, the operation of the first slave clock 72, the second slave clock 76 and third slave clock 84, with the accompanying first transistor 80, second transistor 88 and third transistor 94, control the dynamics of the source current.

Figure 3:
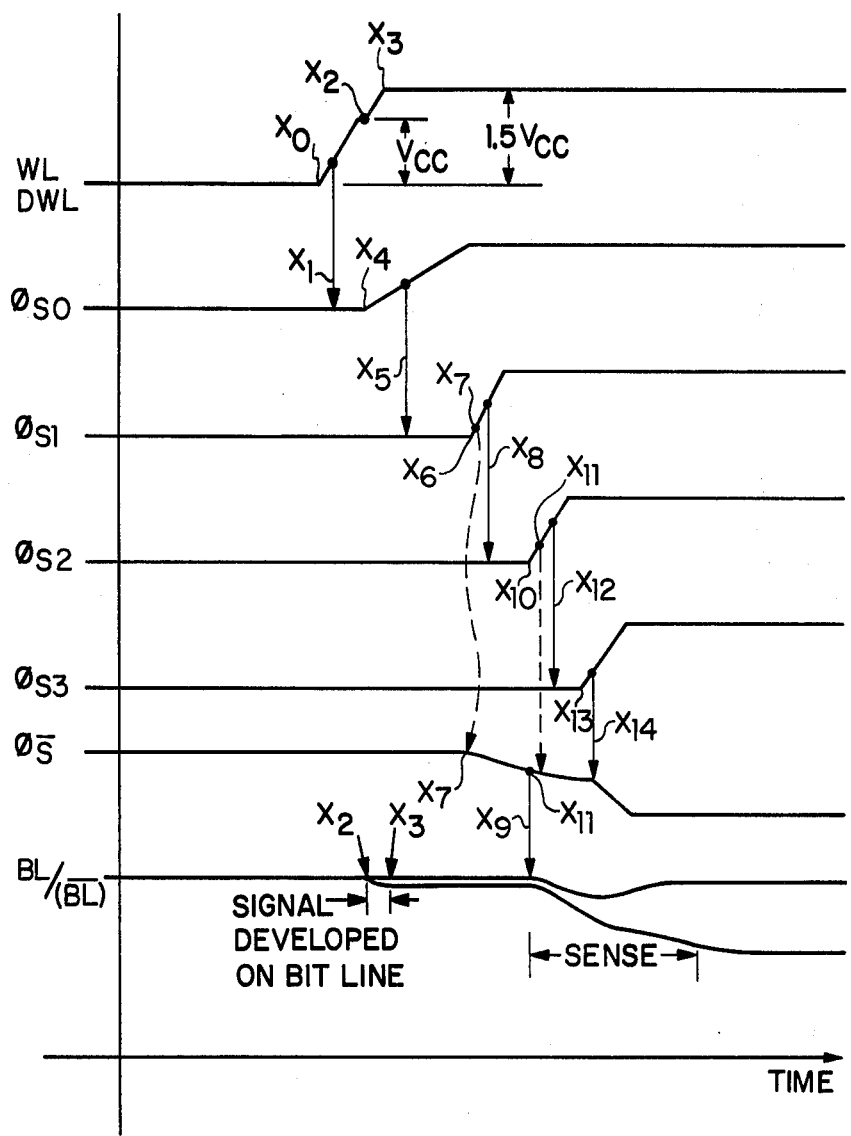
FIG. 3 is a set of related waveform diagrams illustrating the timing operation of the source clocking circuitry according to the invention.

In order to more fully understand the operation of the invention, reference is made to the waveform type timing diagrams of FIG. 3 in connection with FIG. 2. As is well known, the purpose of a sense amplifier, such as the sense amplifier 20A, is to detect the low level data signals generated on the respective bit sense lines 26, 28 during a read cycle. In preparation for read cycle, a voltage is initially applied at the drain electrodes of precharge transistors 42 and 44 through a clock pull up transistor 43. The bit precharge clocks $\phi_{BP}$ applied to the gates of the precharge transistors 42, 44 and to precharge transistor 45 at node C of the latch 20A are thus raised to precharge the bit lines 26, 28 and the node C. The object of the sense amplifier 10A is to compare the charge stored in the dummy storage cell with the charge in the addressed storage cell on the opposite bit line, for example to compare dummy storage cell 48 with storage cell 22. The timing sequence following the main phase initialization clock proceeds as follows (it should be appreciated that the timing involved is very short, on the order of a few nanoseconds).

At time $X_0$ the addressed word line and the appropriate dummy word line are strobed and begin to rise toward a first voltage of $V_{CC}$ which is achieved at time $X_2$. A conduction path is established between the dummy storage capacitor 56 and the bit line 28 as well as between the address storage capacitor 34 and the bit line 26 at time $X_1$ as a threshold voltage is achieved on the dummy word line and the word line. Following a finite delay due to the length of the bit lines and at about time $X_2$. Signals develop at node BL and node $\overline{BL}$ in the latch 20A. The levels differ slightly due to the charge differential between the capacitors 34 and 56 as well as the charge sharing effects with the intrinsic capacitance of 38 and 40. The full signals on bit lines 26 and 28 are not achieved until time $X_3$ when the word line and dummy word line are charged to about 1.5 $V_{CC}$ (at which level they are held until reset for the next cycle).

At time $X_4$ the tracking circuit 66 starts the pull up of output clock signal $\phi_{SO}$. The voltage of the output of the delay driving circuit 66 may be in part retarded by an RC delay as explained hereinafter. At a time $X_5$, the first output signal on line 71 crosses the threshold of the front end of the first slave clock 72, causing it to start its clock cycle.

At time $X_6$, a current limited output clock signal $\phi_{S1}$ begins to pull up the output line 74 and thereby the voltage at the gate electrode 78 of transistor 80 as well as the input to the second slave clock 76. At the threshold voltage of the transistor 80, which occurs at a time $X_7$, current begins to flow through transistor 80 to start to pull down the voltage at node C and to begin to generate the pull down signal $\overline{\phi}_S$. Clock signal $\phi_{S1}$ crosses the preselected threshold of the front end of the second slave clock 76 at time $X_8$ causing second slave clock 76 to begin its clocking sequence.

At time $X_9$, the voltage $100_s$ on the source clock line at node C reaches a difference in voltage with the applied voltage at the gates of latch transistors 16 and 18 corresponding to the threshold drop of the transistor and the latch 20A, causing current to begin to conduct through the source electrode. The signal difference developed on the bit lines 26, 28 begins to be amplified as the latch 20A is activated. The voltage across dummy storage capacitor 56 after charge sharing on bit line 28 is the reference voltage to which the voltage across the bit storage capacitor 34 after charge sharing on bit line 26, is compared by the cross-coupled latch 20A. If the voltage between bit line 26 and the ground reference is greater than the voltage between bit line 28 the ground reference, the voltage at BL will be greater than the voltage at $\overline{BL}$. The cross-coupled latch 20A consequently begins to switch and the nodes BL and $\overline{BL}$ begin to droop as transistor 18 begins to conduct due to the regenerative action of the latch driving the voltage at point $\overline{BL}$ toward the ground reference. The voltage at point BL eventually returns close to the positive voltage $V_{CC}$.

At time $X_{10}$, the output signal $\phi_{S2}$ of the second slave clock 76 begins to rise. At time $X_{11}$ second slave clock 76 has fully turned on transistor 88 and further current is drawn through node C which contributes to the clock strobe $\overline{\phi}_S$. At time $X_{12}$, the output signal $\phi_{S2}$ crosses the threshold level of the front end of the third slave clock 84 causing it to begin its timing cycle. At time $X_{13}$ the output signal $\phi_{S3}$ of the third clock 84 begins to rise. At time $X_{14}$, the output signal $\phi_{S3}$ reaches the threshold of transistor 94 causing it to begin to conduct. Transistor 94 is of relatively high current capacity so that, when it begins to conduct, a substantial amount of current is drawn through node C causing the voltage of signal $\bar{\phi}_S$ to drop quickly toward the ground reference level to fully latch the transistor 16 and 18 at the respective off and on states.

At time $X_7$, about the time the output signal $\phi_{S1}$ begins, at least ninety percent of the total signal developed on the bit line from the edge address cell of the memory array is available at the sense amplifier node BL. In the circuit of FIG. 2, the only critical race conditions which exist during a sensing cycle are between the signal on the dummy word line and a signal indicating that the bit line is valid. If for example the dummy word line triggers the clock prior to the development of a signal on the bit line, the sense amplifier could latch to an incorrect state. By providing the tracking circuit 66, sufficient delay is built in between the strobing of the dummy word line and the commencement of the first portion of the source clock signal $\phi_{S1}$.

Figure 4:
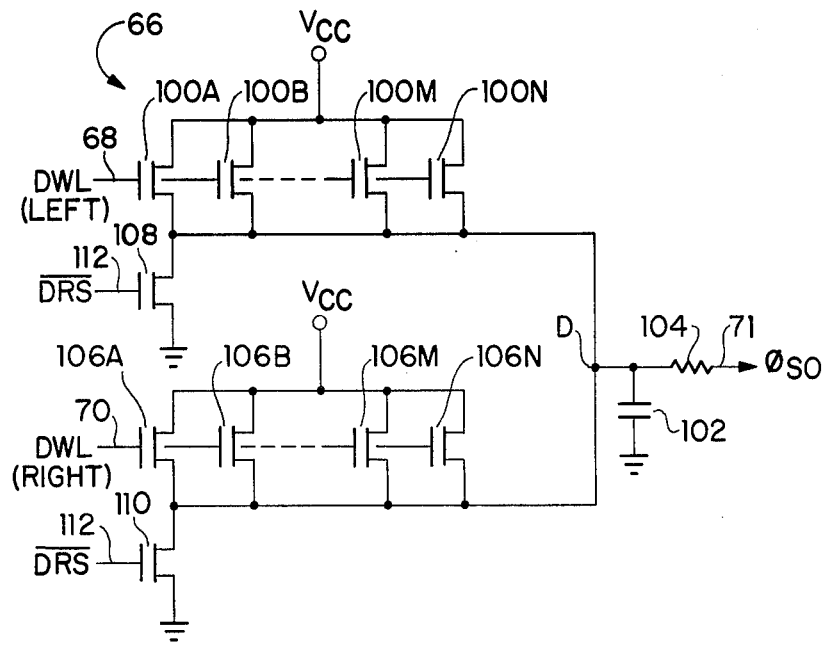
FIG. 4 is a schematic diagram of a tracking circuit for use in the clock according to the invention.

Turning to FIG. 4, a tracking circuit 66 according to the invention is shown. The tracking circuit 66 provides what is called word line/bit line emulation, a technique whereby full tracking of the signal characteristic of the memory array is provided. The tracking circuit 66 comprises a source follower of a signal applied at the dummy word line input 68 or 70. Specifically, the tracking circuit 66 comprises a first bank of source follower transistors 100A, 100B through 100M, 100N with common gate electrodes, source electrodes and drain electrodes. The drain electrodes are coupled to the high voltage source $V_{CC}$. The gate electrodes are coupled to the dummy word line 68. The source electrodes are coupled to a node D across a capacitor 102 to the system ground. The node D is coupled in series through a resistor 104 to the output terminal 71 (FIG. 2) which provides the output signal $\phi_{S0}$. The capacitor 102 and resistor 104 are chosen to emulate the RC delay of the bit line and the storage capacitor 34 or 36, which it tracks. The transistors 100A through 100N are the same size as the transfer gate 50, and thus have the same threshold voltage. It will be noticed for example that the slope of the waveform for the signal $\phi_{S0}$ in FIG. 3 is substantially less than the slope of the signal on the dummy word line which triggers the tracking circuit 66. Specifically, node D tracks node K of the dummy capacitor 56, the source follower transistors 100A through 100N track gate transistor 52, capacitor 102 tracks dummy cell capacitor 56, and resistor 104 tracks bit line 28. Accordingly, the sizes of the elements are chosen to be scaled to one another.

A second bank of source follower transistors 106A, 106B through 106M, 106N having common gate electrodes coupled to the dummy word line 70 is provided with the common source electrode coupled to node D. Transistors 106A through 106N are the same size as transfer gate 52. The drain electrodes are likewise coupled to a drain voltage terminal $V_{CC}$. To each source electrode line of the bank of source follower transistors is coupled a reset transistor 108, 110 respectively. The gate electrode 112 is coupled in common and generally held to a voltage level which would disable, i.e., turn off the transistors 108 and 110 before the main phase initialization clock $\phi_X$. When switched high, through gate eletrode 112, node D is coupled to the ground for discharging the accumulated charge across the capacitor 102 after the read operation.

Figure 5:
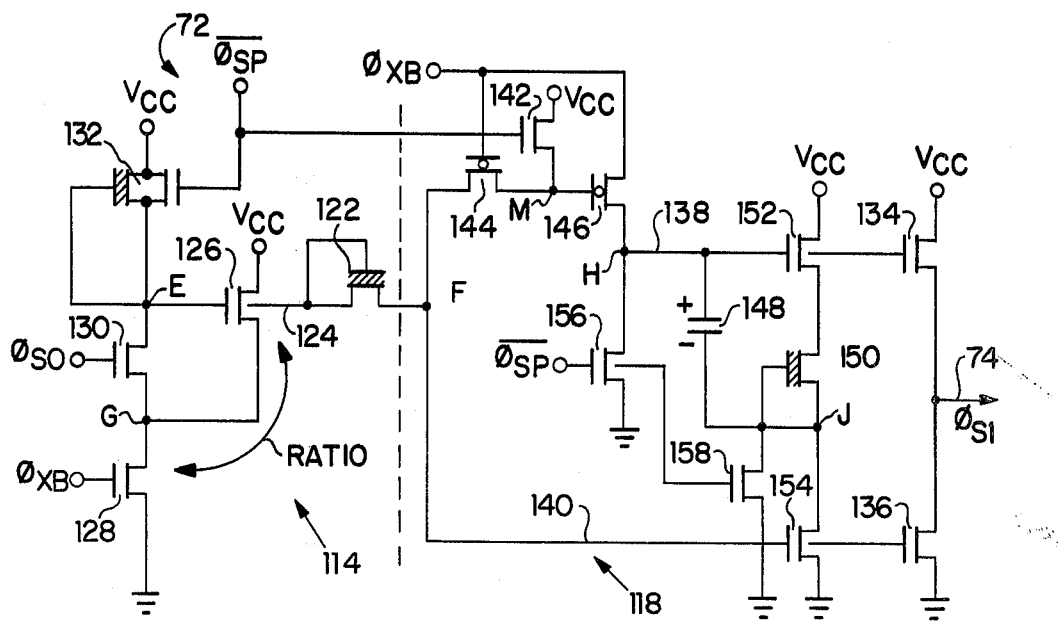
FIG. 5 is a schematic diagram of a first slave clock employed in the clocking circuitry according to the invention.
Figure 6:
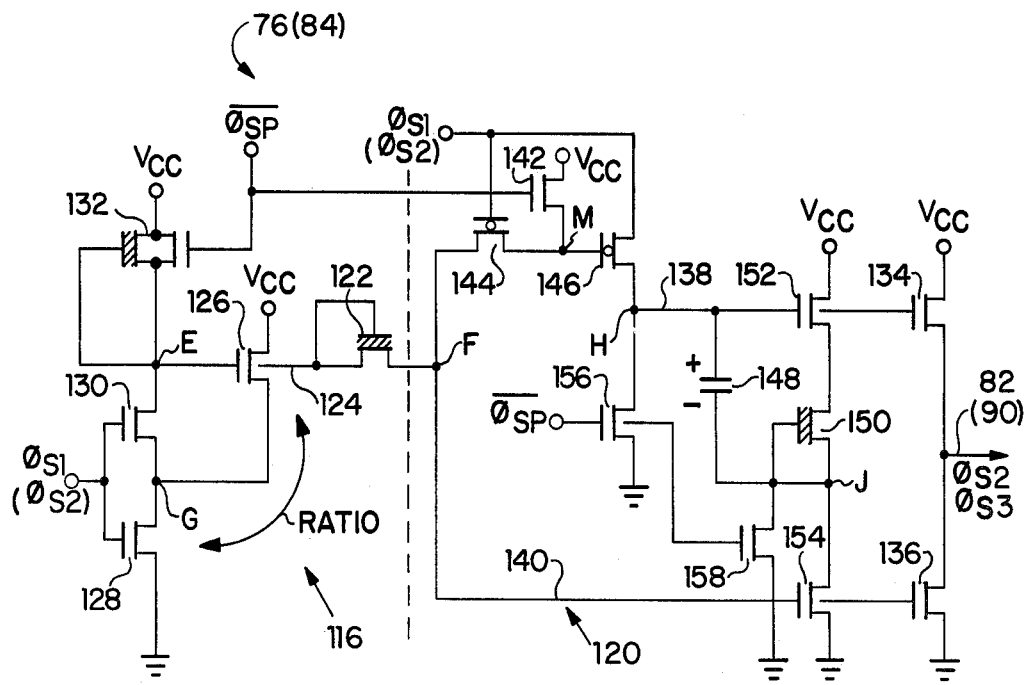
FIG. 6 is a schematic diagram of a second or third slave clock employed in clocking circuitry according to the invention.

Turning to FIGS. 5 and 6, specific embodiments of the first slave clock 72 (FIG. 5), and the second and third slave clocks 76, 84 (FIG. 6) comprise a current limited threshold level controlled trigger input stage 114, 116 and a voltage-boosted current-limited output stage 118, 120. The first slave clock 72 is substantially identical to the second and third slave clocks 76, 84 except for a separate input terminal for a clock signal $\phi_{XB}$ which is a signal generated before the input clock signal $\phi_{S0}$ to minimize loading effects of the slave clock 72 to the input clock signal $\phi_{S0}$, which is relatively weak. The first slave clock 72 and second and third slave clocks 76 and 84 otherwise differ only in the size, i.e., current capacity, of the individual components necessary to provide the drive signals to the subsequent clock and to the gate electrode 78, 86 and 92 of the source current sinking transistors 80, 88 and 94. In the second slave clock 76 and third slave clock 84, loading effects are not a significant problem. Therefore, a single input signal $\phi_{S1}$ (or $\phi_{S2}$) is coupled to two gate terminals of a pair of transistors at the input and to the output stage.

In these specific embodiments of the first slave clock 72, second slave clock 76 and third slave clock 84 (FIGS. 5 and 6), the input stage 114 (116) comprises a current limiting device 122 having one terminal coupled to a node F to the output stage 118 (120) and the other terminal coupled to the gate electrode 124 of a first transistor 126 forming a portion of a resistor divider as hereinafter explained. The current limiting device 122 may be a depletion mode transistor whose source and drain electrodes define the two terminals and whose gate electrode is tied to the gate electrode of transistor 126. The drain electrode of transistor 126 is tied to the positive power supply voltage $V_{CC}$. The source electrode is tied to the drain electrode of a second transistor 128 at a node G, and to the source electrode of a third transistor 130. The gate electrode of the transistor 130 is coupled to the input terminal of the slave clock 76 (84). The drain electrode of the transistor 130 is coupled to the gate electrode of the first transistor 126 at node E. A depletion mode-enhancement mode transistor pair 132 sharing common sources and drains is coupled between node E and the supply voltage. The gate electrode of the depletion mode device of the transistor pair 132 is coupled to the common source electrodes at node E. The gate electrode of the enhancement mode device of the transistor pair 132 is coupled to a clocked input terminal $\bar{\phi}_{SP}$ whose function is to gate the transistor pair 132 in order to precharge node E to the supply voltage level in preparation for a signal supplied at the input.

The ratio of the drain-source areas of the first transistor 126 to the second transistor 128 (the drain-source area of the third transistor 130 matches that of the second transistor 128), defines the voltage level of the turn on point of the third transistor 130. Changing the ratio changes the turn on point of input voltage applied to the gate electrode of the third transistor 130.

An example will clarify the operation of the circuit 114 as a threshold controlled input trigger. With node E charged to the supply voltage, the second transistor 128 off, the voltage at node G is initially high, that is, equal to the supply voltage less the threshold drop across the gate and source of the first transistor 126. When a signal is applied to the gate electrode of the second transistor 128 by the signal $\phi_{XB}$, the second transistor 128 begins to conduct through the first transistor 126. Because of the ratio of the source-drain areas of the first transistor 122 and second transistor 128 and the established high voltage level at the gate of the first transistor 126, first transistor 126 and second transistor 128 form a resistive type of voltage divider at node G. In the case of the first slave clock 72, node G quickly drops toward the ground voltage. If no signal is at the gate electrode of the third transistor 130, then node E remains high. Node F also remains high. However, when a signal is applied at the gate electrode of the third transistor 130, the third transistor 130 begins to turn on at its threshold level above the voltage at node G. As the third transistor 130 turns on, the drain begins to drop toward the voltage at node G, pulling node E and the gate voltage of the first transistor 126 toward ground potential. As node E drops, so also does node F drop at a rate which is current limited by the size of the current limiting device 122. The output stage 118 is thereby driven to change its state.

The output stage comprises first and second output transistors 134, 136 which serve to pull up or pull down the voltage at the output terminal 74, 82, 90. The first output transistor 134 has its drain electrode coupled to the high voltage reference, its source electrode coupled to the output terminal, and its gate electrode coupled to a booster line 138 at a node H. The second output transistor 136 has its drain electrode coupled to the output terminal, its source electrode coupled to ground, and its gate electrode coupled to a release line 140 at node F. Transistor pair 132 are provided to initially precharge node F.

A voltage boosting circuit comprising transistor 142, transistor 144, and transistor 146 is provided to establish the voltage at node H. The circuit of transistors 142, 144 and 146 forms a dynamic power-up circuit for the output stage. Transistor 146 has its source coupled to node H and its drain coupled to either the input precharge signal line carrying signal $\phi_{XB}$ (FIG. 5) or the input clock line $\phi_{S1}$, $\phi_{S2}$ (FIG. 6). Transistor 142 has its drain electrode coupled to the high voltage reference and its source electrode coupled to the gate electrode of transistor 146. The gate electrode of transistor 142 is coupled to the precharge clock signal line carrying signal $\overline{\phi}_{SP}$. Transistor 144 has its drain electrode coupled to the gate electrode of transistor 146 and drain electrode of transistor 142, it source electrode coupled to node F and its gate electrode coupled to the drain electrode of transistor 146.

The output stage further includes an RC circuit comprising a capacitor 148 and, a current limiting device operative as a resistor 150, a pull-up transistor 152 and a pull-down transistor 154. The pull-up transistor 152 has its gate electrode coupled to booster line 138 at node H, its drain electrode coupled to the supply voltage $V_{CC}$ and its source electrode coupled to one terminal of the current limiting device 150. The pull-down transistor 154 has its gate electrode coupled to release line 140 at node F, its source electrode coupled to ground, and its drain electrode coupled to the other terminal of current limiting device 150 at a node J. The capacitor 148 is coupled between the drain of the pull-down transistor 154 and the gate of the pull-up transistor 152. The current limiting device 150 may be a depletion mode transistor whose gate electrode is coupled to its own source electrode. Reset transistors are coupled across capacitor 148. Specifically, a first reset transistor 156 has its drain electrode coupled to node H and its source electrode coupled to ground, a second reset transistor 158 has its drain electrode coupled to the other terminal of the capacitor 148 at node J and its source electrode coupled to ground. The gate electrodes of the first and second reset transistors 156, 158 are coupled in common to the stock signal $\overline{\phi}_{SP}$ for resetting the output stage.

The output stage 118, 120 operates as follows:

In its initial state, the output stage 118, 120 maintains the output terminal 74, 82, 90 at ground, the booster line 138 and node H at ground, and node J at ground. The reset clock signal terminal $\overline{\phi}_{SP}$ and node F from the input stage 114 are at the supply voltage $V_{CC}$, so that node M at the gate of transistor 146 is at the supply voltage less the threshold voltage $V_{CC}$-$V_{TE}$ of transistor 142. Initially also, the input clock to the gate of transistor 144 and the drain of transistor 146 is at the ground potential.

Operation begins when clock signal $\overline{\phi}_{SP}$ goes low to decouple node M and to turn off the reset transistors 156 and 158. Thereafter, as in FIG. 5, the clocked power supply signal $\phi_{XB}$ rises, causing node H to pull up quickly. Transistor 146, acting as a capacitor, boosts node M above the supply voltage $V_{CC}$ to allow node H to reach the full supply voltage level $V_{CC}$.

Node J, however, is held at ground, thus charging capacitor 148. The output through the drain of transistor 136 is held low by transistor 136.

Shortly afterward release line 140 is driven low by the input stage 114, 116 applying a signal drop through current limiting means 122 at node F. Consequently node M is also pulled low through transistor 144, isolating node H from the clocked power supply signal $\phi_{XB}$ in preparation for boosting node H above $V_{CC}$.

When node F drops below the threshold voltage of transistors 154 and 136, node J and the output are released as the transistors 154, 136 turn off. Node J then begins to rise, boosting the voltage level at node H.

According to the invention, the rate of rise of node J and hence the rate of rise of node H is regulated by the current limiter 150, which draws current through transistor 152.

The pull-up transistor 152 and the output transistor 134 share a common gate and drain potential. The output rise characteristic at the source of transistor 134 (line 74) thus tracks the rise characteristic of node J. Specifically, the current supplied by transistor 134 is controlled by the voltage at its gate which is at node H. The rise characteristic of node H is independent of the loading on line 74, and is controlled by the rise time of the node J through the current limiter 150. The output rise characteristic is thus regulated by the current limiter 150.

The circuitry thus described is characterized by substantial insensitivity to selected parameters which might otherwise prevent the proper operation of the system. Specifically, the trigger input voltage level of the input stage 114, 166 is insensitive to variations in supply voltage, and has reduced sensitivity to fabrication process parameters and temperature. The controlled release rate of node F through current limiter 122 is insensitive to supply voltage variation and has reduced sensitivity fabrication process variation. Finally, the regulated output stage rise characteristic of the slave clocks is insensitive to supply voltage variation and has reduced sensitivity to fabrication process variation.

The invention thus described is a clocking scheme for a fully compensated dynamic sense amplifier in which the sensing circuitry tracks the rise characteristic of the word line, the threshold voltage of the storage cell transfer gate, and the RC delay of the bit line, and in which the sensing clocks have trigger, delay and output characteristics which have been rendered substantially insensitive to variations in temperature, power supply voltage, and fabrication process parameters. Substantially no sense time is wasted while data integrity is maintained over the range of operating conditions and fabrication process parameters for the integrated circuit.

The invention has now been explained with respect to specific embodiments. Other embodiments will now be apparent to those of ordinary skill in this art. It is therefore not intended that this invention be limited except as indicated by the appended claims.

We claim:

1. For use in a capacitive storage integrated circuit memory device having at least one sense amplifier of a type employing a latch including cross-coupled field effect transistors with common source electrodes, said sense amplifier for sensing and comparing charge on a bit line coupled to each drain electrode of each one of said transistors of said latch, each said bit line being selectively coupled to a storage cell through a transistor switch transfer gate in response to signals applied to a word line, an apparatus for controlling sense rate of said bit lines comprising:

means operative to sense said word line signals for initiating a clock sequence, said clock sequence initiating means producing a first output signal having a first dynamic characteristic which is delayed relative to said word line signals;

first clock means responsive to said first output signal for generating a second output signal having a second dynamic characteristic which is delayed relative to said first output signal;

second clock means responsive to said second output signal for generating a third output signal having a third dynamic characteristic which is delayed relative to said second output signal and which overlaps in time said second output signal; and means operative to amplify current in proportion to at least said second output signal and to said third output signal and to sum said amplified current for applying current in a controlled manner to said common source electrodes to strobe said source electrodes at a controlled sense rate.

2. The apparatus according to claim 1 further including third clock means responsive to said third output signal for generating a fourth output signal having a fourth dynamic characteristic and which is delayed relative to said third output signal and which overlaps in time said third output signal, and wherein said current applying means is also coupled to amplify and sum current proportional to said fourth output signal.

3. The apparatus according to claim 2 wherein said current generating means includes a plurality of current amplifying transistors, each current amplifying transistor having a gain characteristic selected to contribute to a dynamic current characteristic which is a composite of said dynamic characteristics and delays of said second, third and fourth output signals.

4. The apparatus according to claim 1 further including current limiting means disposed to couple each bit line to each drain electrode of said cross-coupled field effect transistors.

5. The apparatus according to claim 4 wherein each said current limiting means comprises a depletion mode field effect transistor.

6. The apparatus according to claim 1 wherein said clock sequence initiating means comprises a bank of field effect transistors having common drain electrodes, common source electrodes and common gate electrodes, said gate electrodes being coupled to receive said word line signal, each transistor of said bank having the same threshold voltage characteristic as said storage cell transistor switch transfer gate, said source electrode being coupled to a series coupled resistor, and to a capacitor means, said capacitor means being shunted to a circuit common, said resistor and capacitor means having an RC delay characteristic which emulates a characteristic RC delay related to said bit line and to said storage cell.

7. The apparatus according to claim 1 wherein each said clock means includes an input stage that comprises a controlled threshold trigger in which said trip point is established by a ratio of the width of the source-drain region of a pair of field effect transistors.

8. The apparatus according to claim 7 wherein said input stage of each clock means includes current limiting means for regulating the dynamic signal characteristic thereof in a manner substantially independent of supply voltage variation and with reduced sensitivity to fabrication process variation.

9. The apparatus according to claim 8 wherein said current limiting means comprises first depletion mode transistor between said input stage and an output stage of each of said clock means.

10. The apparatus according to claim 9 wherein said output stage of each of said clock means includes current limiting means for regulating the output dynamic characteristic thereof in a manner substantially independent of supply voltage variation and with reduced sensitivity to fabrication process variation.

11. The apparatus according to claim 10 wherein said current limiting means further includes a depletion mode transistor coupled between a pull-up transistor and a capacitor and wherein said capacitor is operative to control the output rise characteristic of said output stage.

* * * * *